United States Patent [19]

Hirai et al.

[11] Patent Number: 4,585,704

[45] Date of Patent: Apr. 29, 1986

[54] ELECTRICALLY CONDUCTIVE $Si_3N_4$—C SERIES AMORPHOUS MATERIAL AND A METHOD OF PROCESSING THE SAME

[76] Inventors: Toshio Hirai, 4-91, Takamori 3-chome; Takashi Goto, 2-12-304, Kuromatsu 3-chome, both of Izumi City, Japan

[21] Appl. No.: 642,700

[22] Filed: Aug. 21, 1984

Related U.S. Application Data

[60] Continuation of Ser. No. 428,274, Sep. 29, 1982, abandoned, which is a division of Ser. No. 170,168, Jul. 18, 1980, Pat. No. 4,393,097.

[30] Foreign Application Priority Data

Jul. 24, 1979 [JP] Japan ................................. 54-93942

[51] Int. Cl.⁴ ............................................... B32B 9/00

[52] U.S. Cl. ..................................... 428/446; 252/502; 428/367; 428/408; 428/688; 428/698

[58] Field of Search ............... 428/408, 448, 688, 698; 427/94, 95, 241, 255.2; 252/502, 367

[56] References Cited

U.S. PATENT DOCUMENTS

| | | | |
|---|---|---|---|
| 4,036,653 | 7/1977 | Jacobson | 423/266 |
| 4,158,717 | 6/1979 | Nelson | 428/446 |
| 4,187,344 | 2/1980 | Fredriksson | 428/698 |
| 4,393,097 | 7/1983 | Hirai et al. | 428/698 |

*Primary Examiner*—George F. Lesmes
*Assistant Examiner*—William M. Atkinson
*Attorney, Agent, or Firm*—Parkhurst & Oliff

[57] ABSTRACT

Electrically conductive $Si_3N_4$—C series amorphous material having excellent thermal and mechanical characteristics is produced in a massive size by chemical vapor deposition.

10 Claims, 20 Drawing Figures

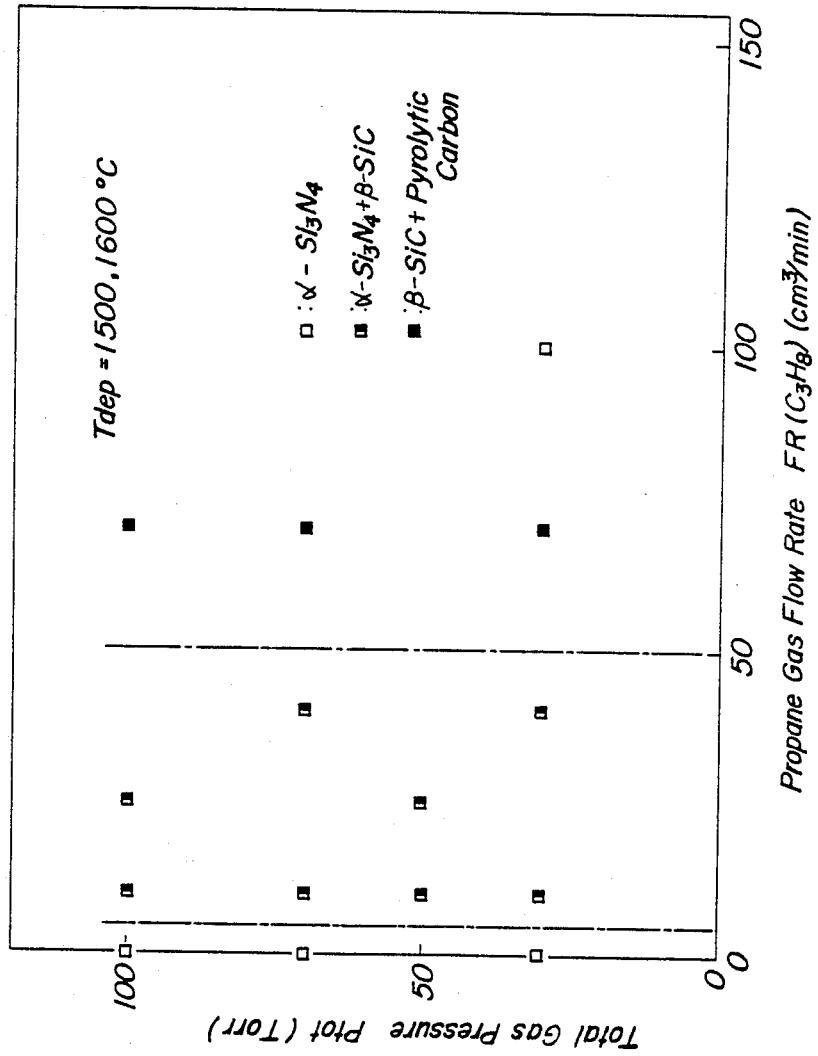

FIG.7  a: Propane Gas Flow Rate of 0 cm³/min
b: Propane Gas Flow Rate of 100 cm³/min
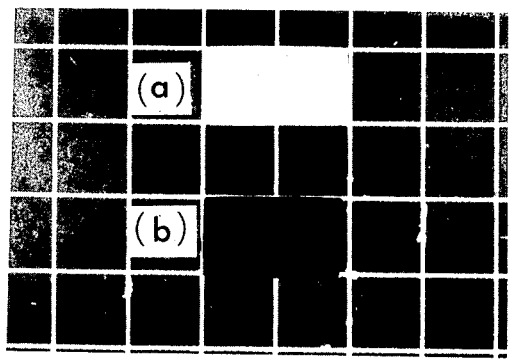
FIG.8a  a: Propane Gas Flow Rate of 0 cm³/min
FIG.8b  b: Propane Gas Flow Rate of 100 cm³/min
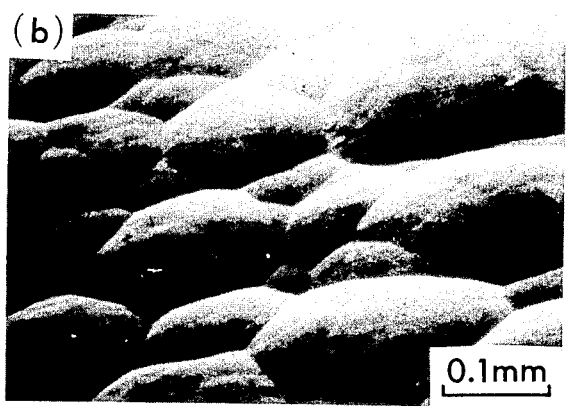

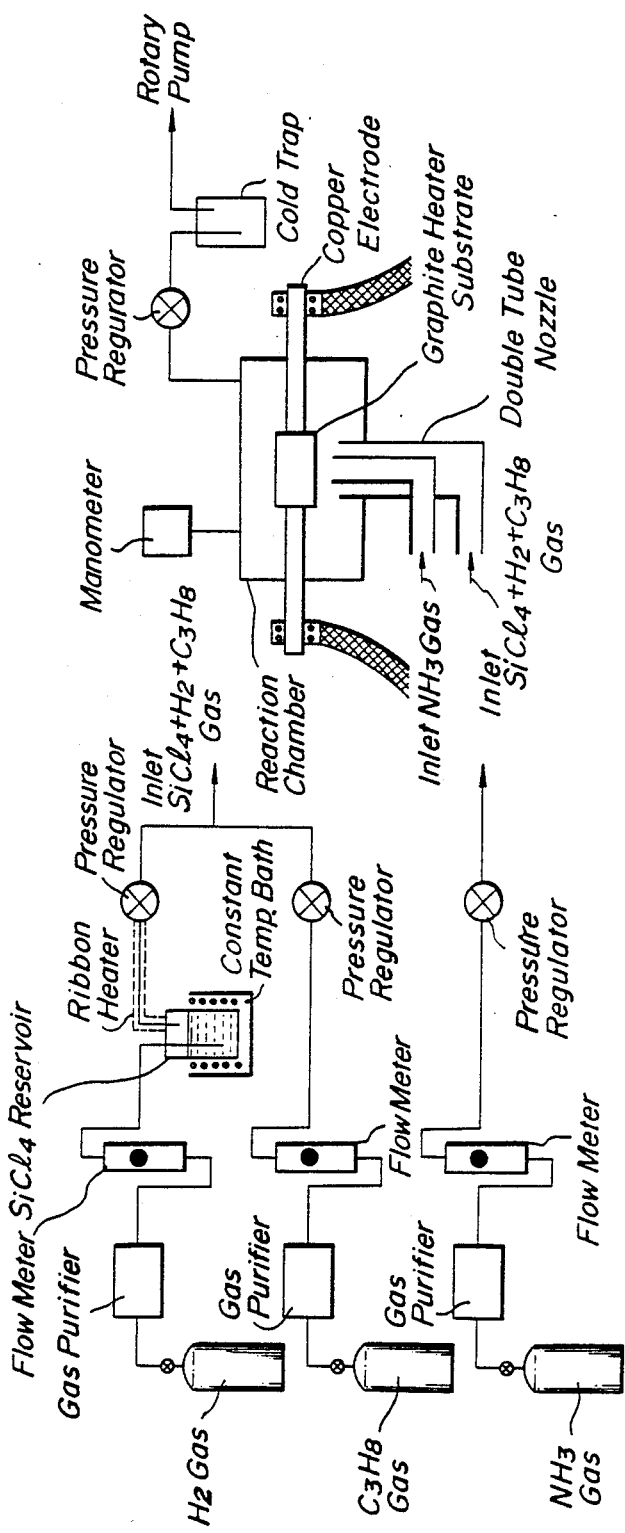
FIG_19

ELECTRICALLY CONDUCTIVE Si$_3$N$_4$—C SERIES AMORPHOUS MATERIAL AND A METHOD OF PROCESSING THE SAME

BACKGROUND OF THE INVENTION

This is a continuation of application Ser. No. 428,274 filed Sept. 29, 1982 now abandoned which in turn is a division of application Ser. No. 170,168, filed July 18, 1980, now U.S. Pat. No. 4,393,097.

The present invention relates to an electrically conductive Si$_3$N$_4$—C series amorphous material and a method of producing the same.

Recently, there has been interest in silicon nitride Si$_3$N$_4$ as a high temperature structural material and an electrically insulative material.

In U.S. Pat. No. 4,036,653, there is disclosed an amorphous nitride composition consisting essentially of from 95.0-99.9% by weight of amorphous silicon nitride and from 0.1-5.0% by weight of carbon prepared by the vapor phase reaction of silicon tetrachloride, ammonia and a gaseous hydrocarbon at temperatures from 1,000° to 1,500° C. However, the amorphous nitride composition is obtained only in an impure powder form as described in Example 1 of the U.S. patent, so that it cannot be produced in a massive body without purification and sintering.

In U.S. Pat. No. 4,118,539 filed by one of the inventors of the present application, there is disclosed a production of superhard silicon nitride having an industrially usable massive size and large thermal shock resistance by a synthetic process of chemical vapor deposition (CVD). The Si$_3$N$_4$ of the U.S. Pat. No. 4,118,539 has a high thermal conductivity, an excellent thermal shock resistance property and a high hardness not only at low temperatures but also at high temperatures, so that it is a useful material at high temperatures. In addition, its electric resistance is so extremely large that it is also useful an electrically insulative material in the electrical and electronic industry. Meanwhile, if it is imparted with an electrical conductivity, vast uses can be expected as a high temperature electric material and a high hard electric material.

SUMMARY OF THE INVENTION

It is accordingly an object of the present invention to provide an electrically conductive massive Si$_3$N$_4$—C series amorphous solid having the superior thermal and mechanical characteristics of the above Si$_3$N$_4$ amorphous material.

Another object of the present invention is to provide an electrically conductive massive and pure Si$_3$N$_4$—C series amorphous solid having the superior thermal and mechanical characteristics of the above Si$_3$N$_4$ amorphous material.

A further object of the present invention is to provide electrically conductive massive and pure Si$_3$N$_4$—C series amorphous solid with various electric resistances having the superior thermal and mechanical characteristics of the above Si$_3$N$_4$ amorphous solid.

The massive Si$_3$N$_4$—C series amorphous material of the present invention is obtained by chemical vapor deposition process, and is composed of a deposited amorphous Si$_3$N$_4$ matrix and codeposited carbon uniformly distributed or intermingled in the matrix, and has an electrical conductivity $\sigma$ of a formula $$\sigma = \sigma_0 \exp(-E/2kT)$$

wherein $\sigma_0$ is an electrical conductivity at 0° K., E is a value of 0.02-0.06 eV, k is the Boltzmann constant and T is an absolute temperature.

The massive Si$_3$N$_4$—C series amorphous solid of the present invention can be produced by chemical vapor deposition process, which comprises reacting a silicon source gas, a nitrogen source gas and a hydrogen source gas with a carbon source gas under a deposition condition of a deposition temperature of about 1,100° to 1,300° C. and a total gas pressure of about 30-70 mmHg to deposit the Si$_3$N$_4$—C series amorphous solid on a substrate surface.

BRIEF DESCRIPTION OF THE DRAWINGS

FIG. 6 is a characteristic graph showing effects of propane gas flow rate and total gas pressure on deposits prepared at T$_{dep}$=1,500° and 1,600° C.

FIG. 7 shows surfaces of amorphous Si$_3$N$_4$ without containing carbon and the Si$_3$N$_4$—C series amorphous material prepared at T$_{dep}$=1,300° C., P$_{tot}$=30 mmHg and propane gas flow rates of 0 cm$^3$/min (a) and 100 cm$^3$/min (b), 1 division being a length of 12.5 mm.

FIGS. 8a and 8b are scanning electron micrographs of surfaces of amorphous Si$_3$N$_4$ without containing carbon and the massive and pure Si$_3$N$_4$—C series amorphous solid prepared at T$_{dep}$=1,300° C., P$_{tot}$=30 Torr and propane gas flow rates of 0 cm$^3$/min and 100 cm$^3$/min, respectively.

FIG. 19 is an apparatus as shown in the U.S. Pat. No. 4,118,539 but modified in a few points for practicing the present invention.

DETAILED DESCRIPTION OF THE INVENTION

The massive and pure $Si_3N_4$—C series amorphous solid of the present invention is homogeneous and has an electrical conductivity value $\sigma$ of about $10^{-3}$ to $10^{-1} \Omega - 1cm^{-1}$ at a temperature from ambient to about 900° C., a density of about 2.7–3.0 g/cm$^3$, a thermal conductivity of about 0.004–0.010 cal/cm·sec·K at ambient temperature, a specific heat of about 0.16 cal/g·K at ambient temperature, a thermal diffusivity of about 0.010–0.022 cm$^2$/sec at ambient temperature and a micro Vickers hardness of about 2,500–3,500 kg/mm$^2$ under a load of 100 g at ambient temperature.

According to the process of the present invention, large massive $Si_3N_4$—C series amorphous solids can be obtained in the same size as that of $Si_3N_4$ of the U.S. Pat. No. 4,118,539.

Figure 1:
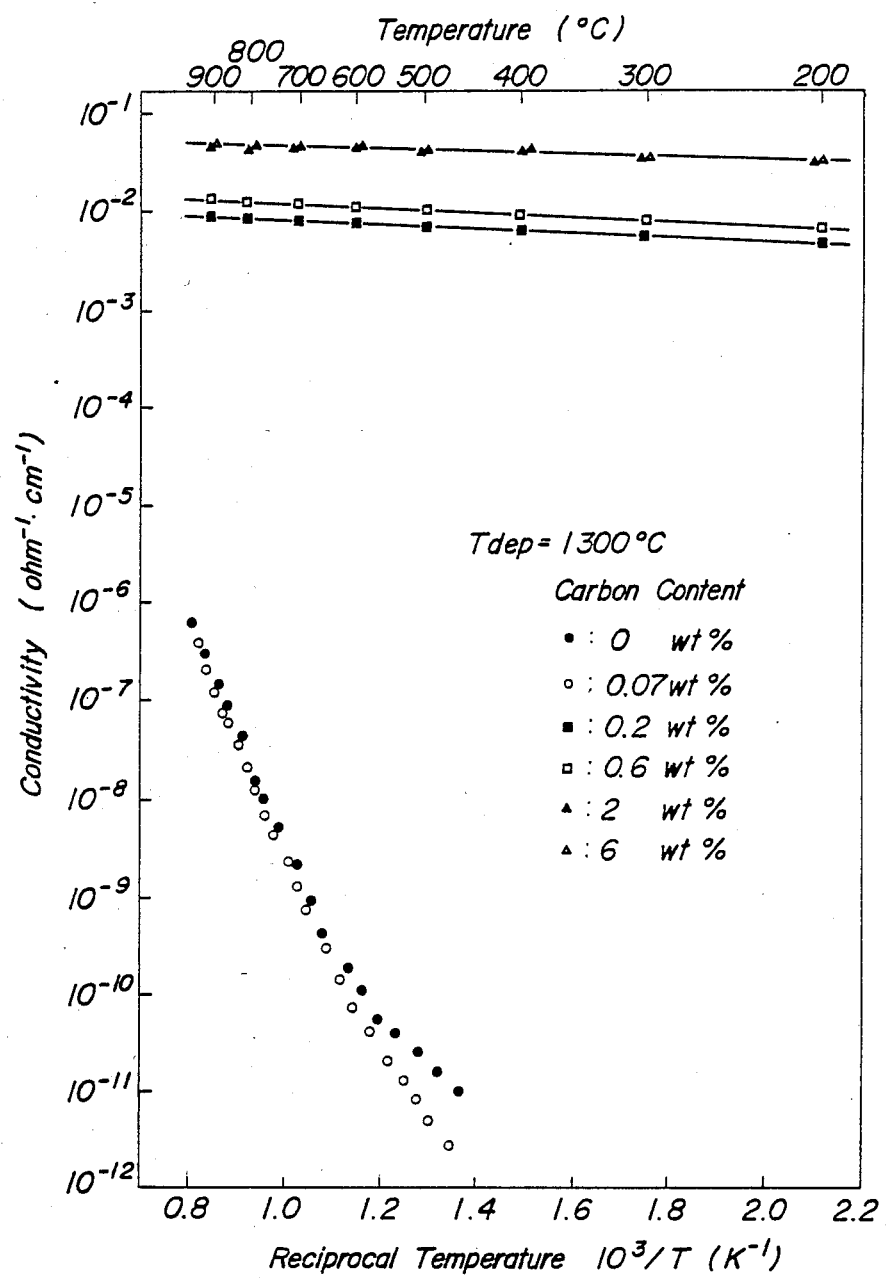
FIG. 1 is a characteristic graph showing electrical conductivities of the massive and pure Si$_3$N$_4$—C series amorphous solid having various carbon contents of the present invention at high temperatures obtained at a deposition temperature of 1,300° C. under various propane gas flow rates.
Figure 2:
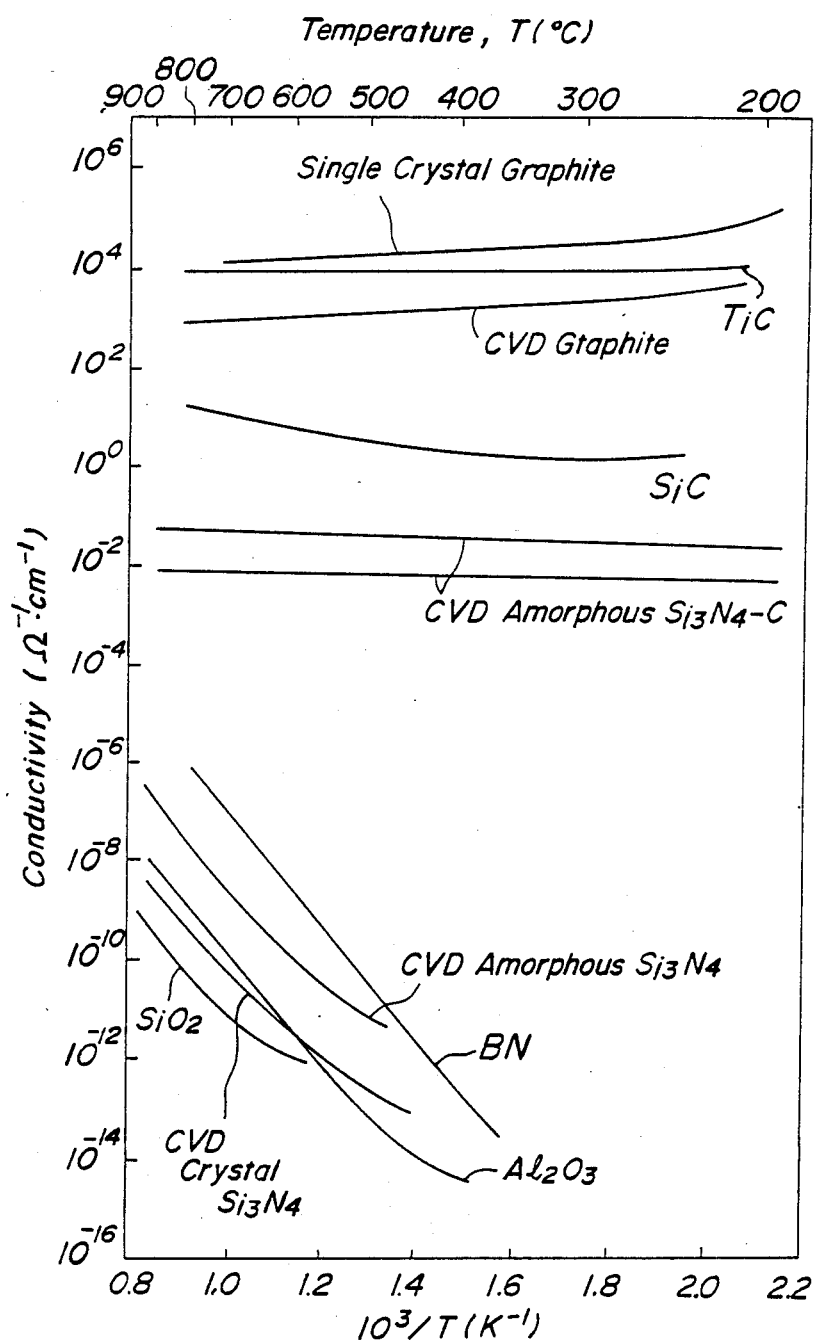
FIG. 2 is a characteristic graph showing a relation between temperatures and electrical conductivity of the Si$_3$N$_4$—C series amorphous material of the present invention in comparison with those of other ceramics.
Figure 3:
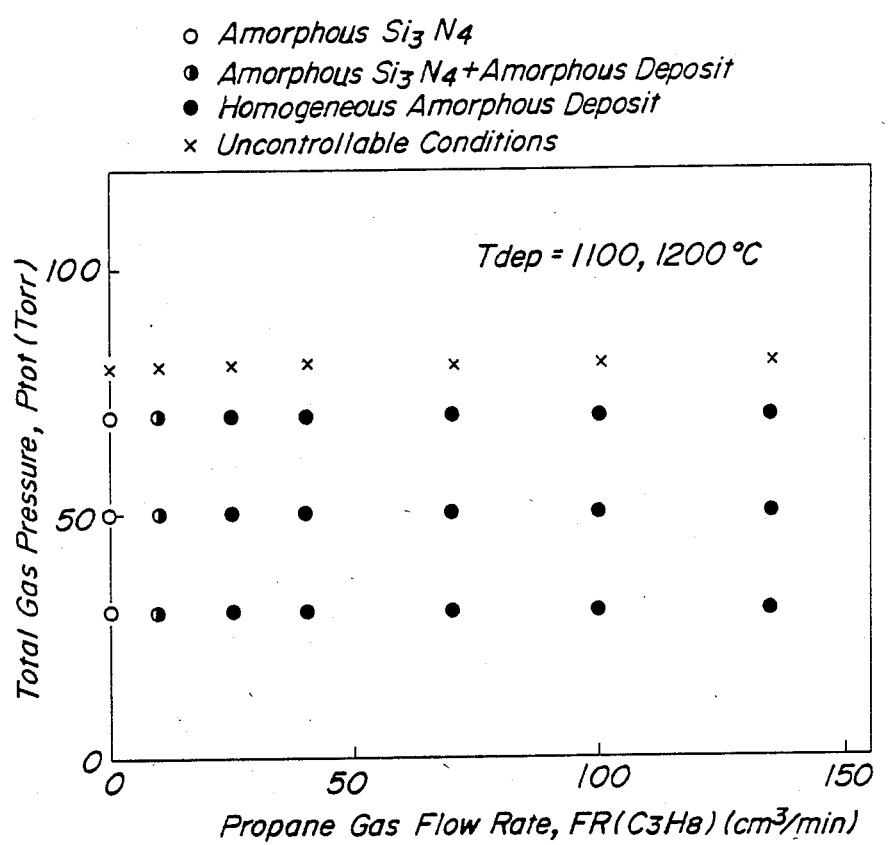
FIG. 3 is a characteristic graph showing effects of propane gas flow rate FR (C$_3$H$_8$) and total gas pressure P$_{tot}$ in the reaction furnace on deposits prepared at deposition temperatures T$_{dep}$=1,100° and 1,200° C.
Figure 4:
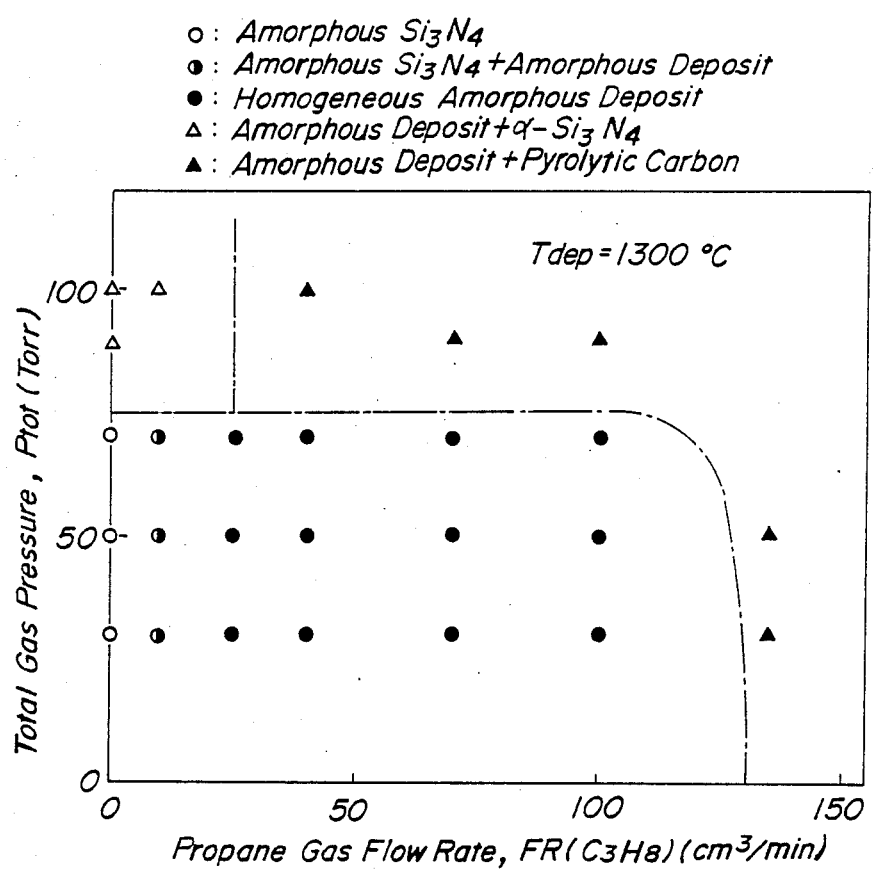
FIG. 4 is a characteristic curve showing effects of propane gas flow rate and total gas pressure P$_{tot}$ on deposits prepared at T$_{dep}$=1,300° C.
Figure 5:
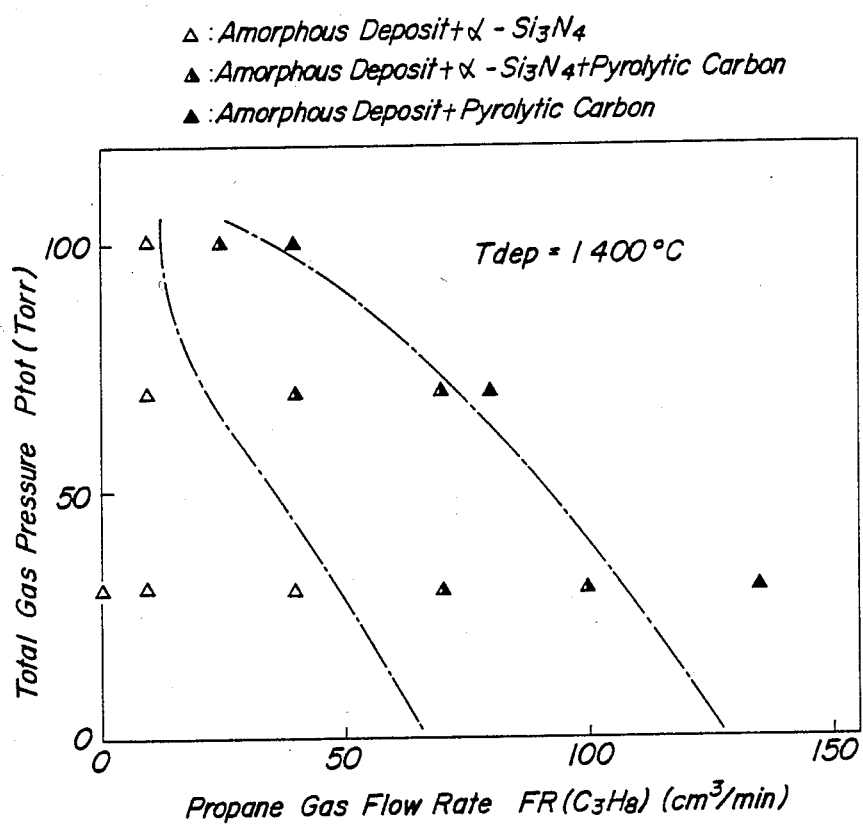
FIG. 5 is a characteristic graph showing effects of propane gas flow rate and total gas pressure on deposits prepared at T$_{dep}$=1,400° C.
Figure 9:
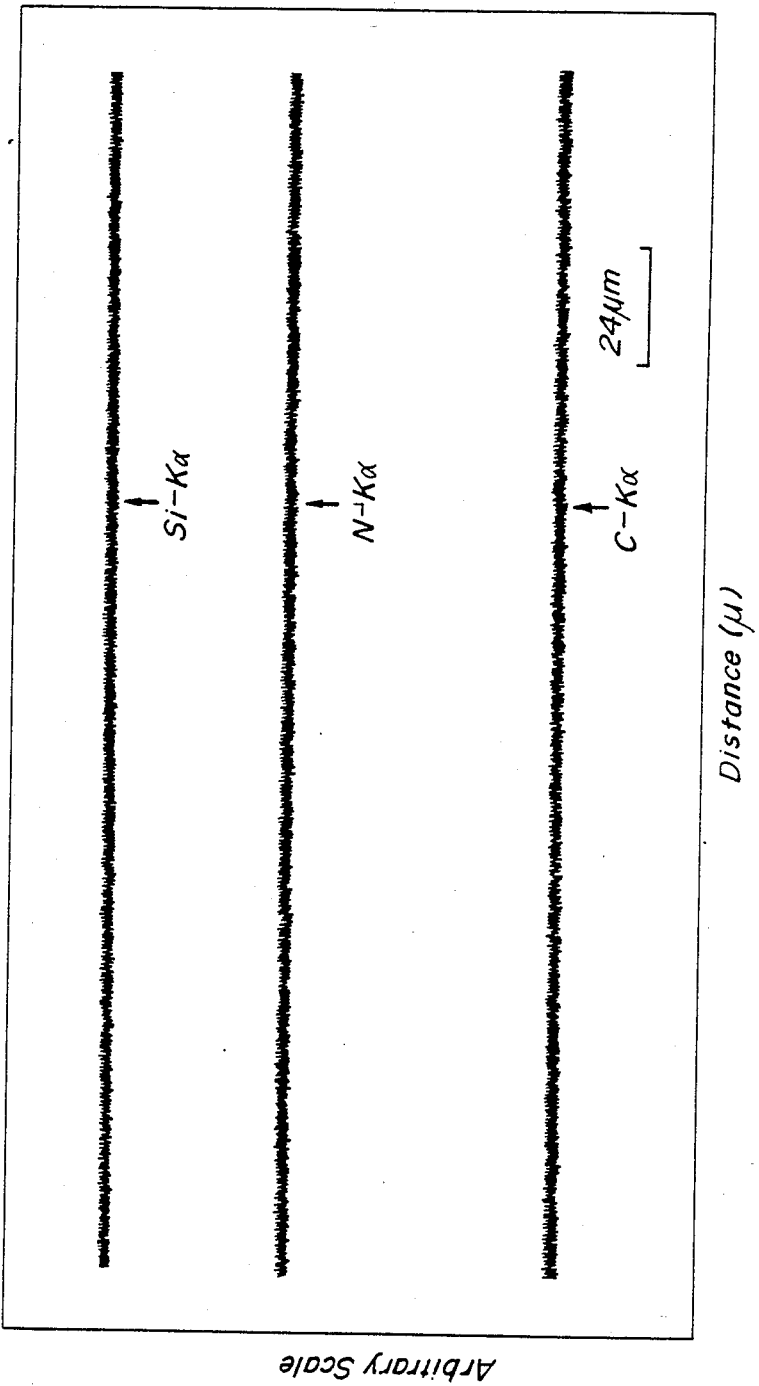
FIG. 9 is a characteristic graph showing results of an electron probe micro analysis (EPMA) for Si, N and C contents of cross-sectional surface of the massive and pure Si$_3$N$_4$—C series amorphous solid prepared at T$_{dep}$=1,300° C., P$_{tot}$=30 Torr and a propane gas flow rate of 70 cm$^3$/min.
Figure 10:
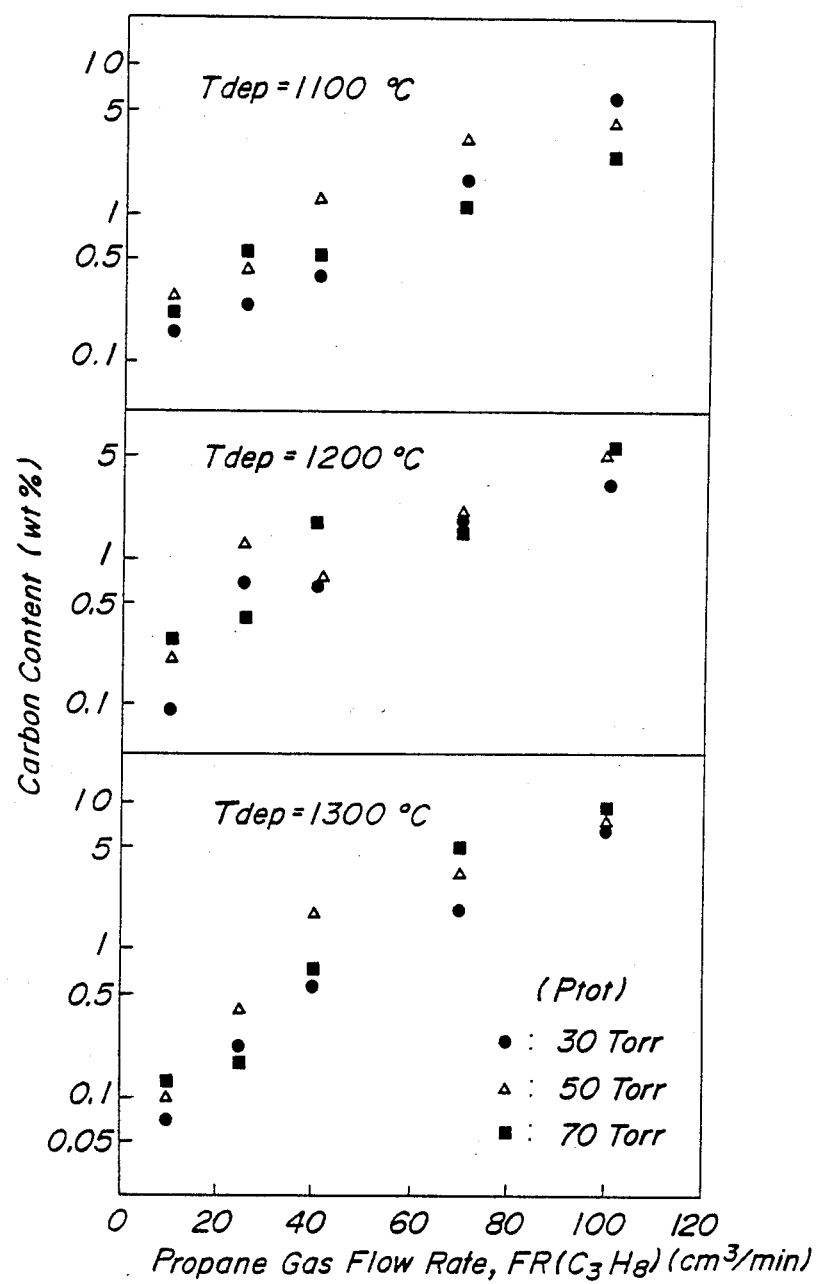
FIG. 10 is a characteristic graph showing an effect of propane gas flow rate on carbon content of the massive and pure Si$_3$N$_4$—C series amorphous solids prepared at T$_{dep}$=1,100°, 1,200° and 1,300° C.
Figure 11:
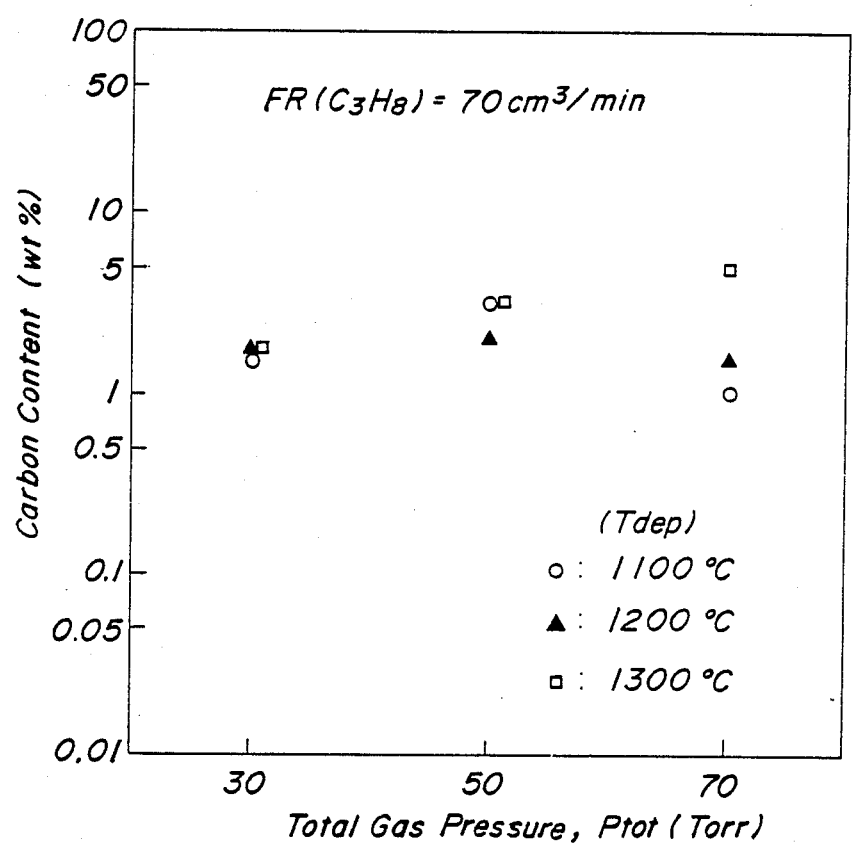
FIG. 11 is a characteristic graph showing an effect of total gas pressure P$_{tot}$ on carbon content of the massive and pure Si$_3$N$_4$—C series amorphous solid prepared at a propane gas flow rate of 70 cm$^3$/min.
Figure 12:
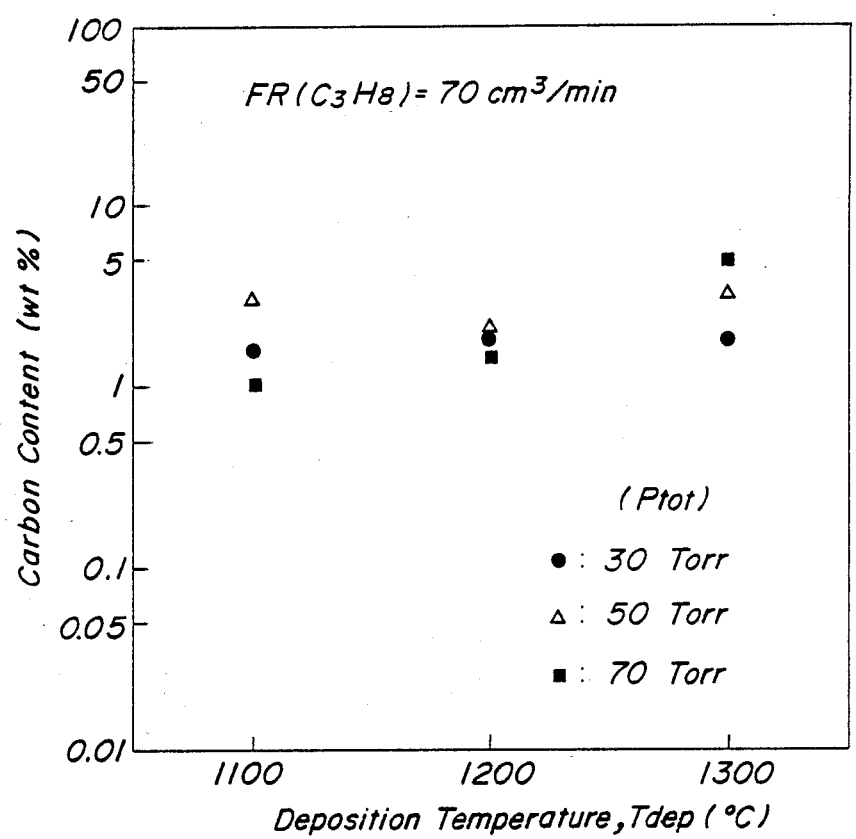
FIG. 12 is a characteristic graph showing an effect of deposition temperature T$_{dep}$ on carbon content of the massive and pure Si$_3$N$_4$—C series amorphous solid prepared at a propane gas flow rate of 70 cm$^3$/min.
Figure 13:
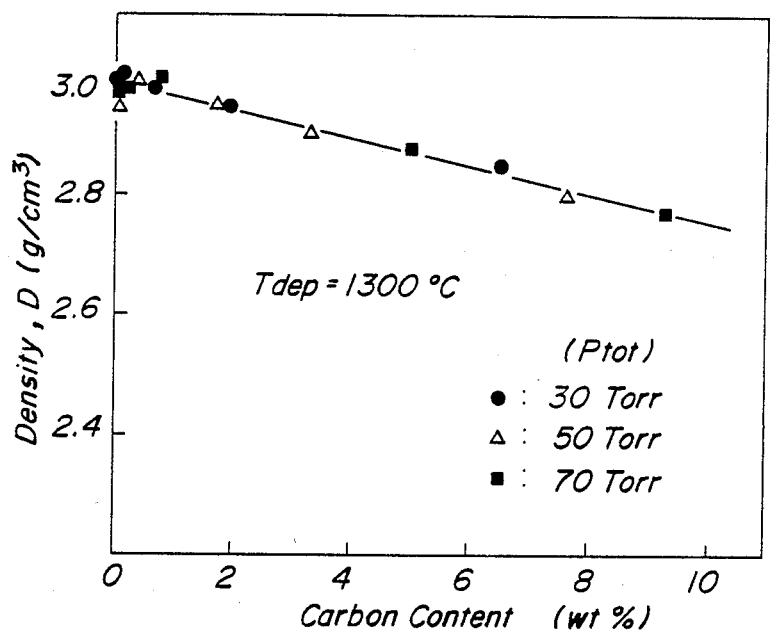
FIG. 13 is a characteristic graph showing relations between carbon content and density of the massive and pure $Si_3N_4$—C series amorphous solids prepared at $T_{dep}=1,300°$ C. under various total gas pressure in the furnace.
Figure 14:
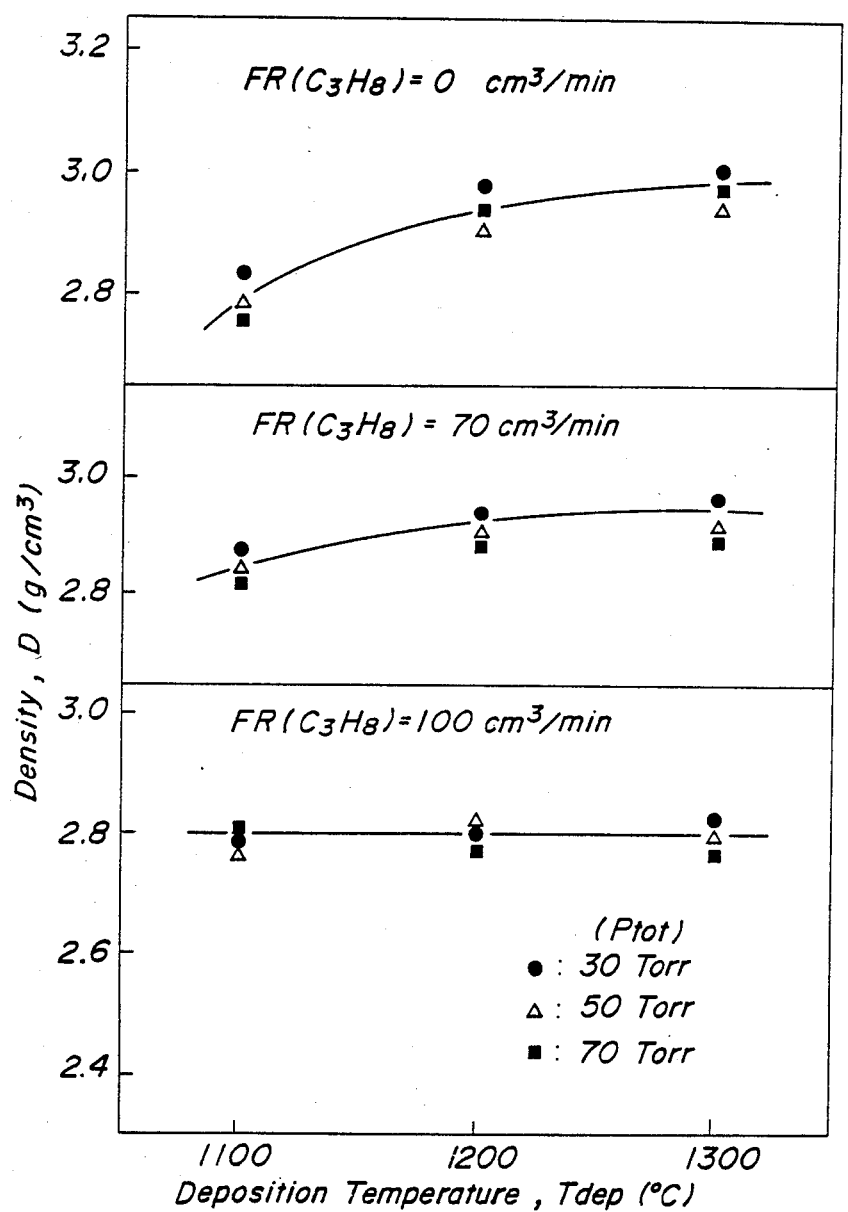
FIG. 14 is a characteristic graph showing relations between deposition temperature $T_{dep}$ and density of the massive and pure $Si_3N_4$—C series amorphous solid prepared at propane gas flow rates of 0, 70 and 100 cm$^3$/min under various total gas pressures in the furnace.
Figure 15:
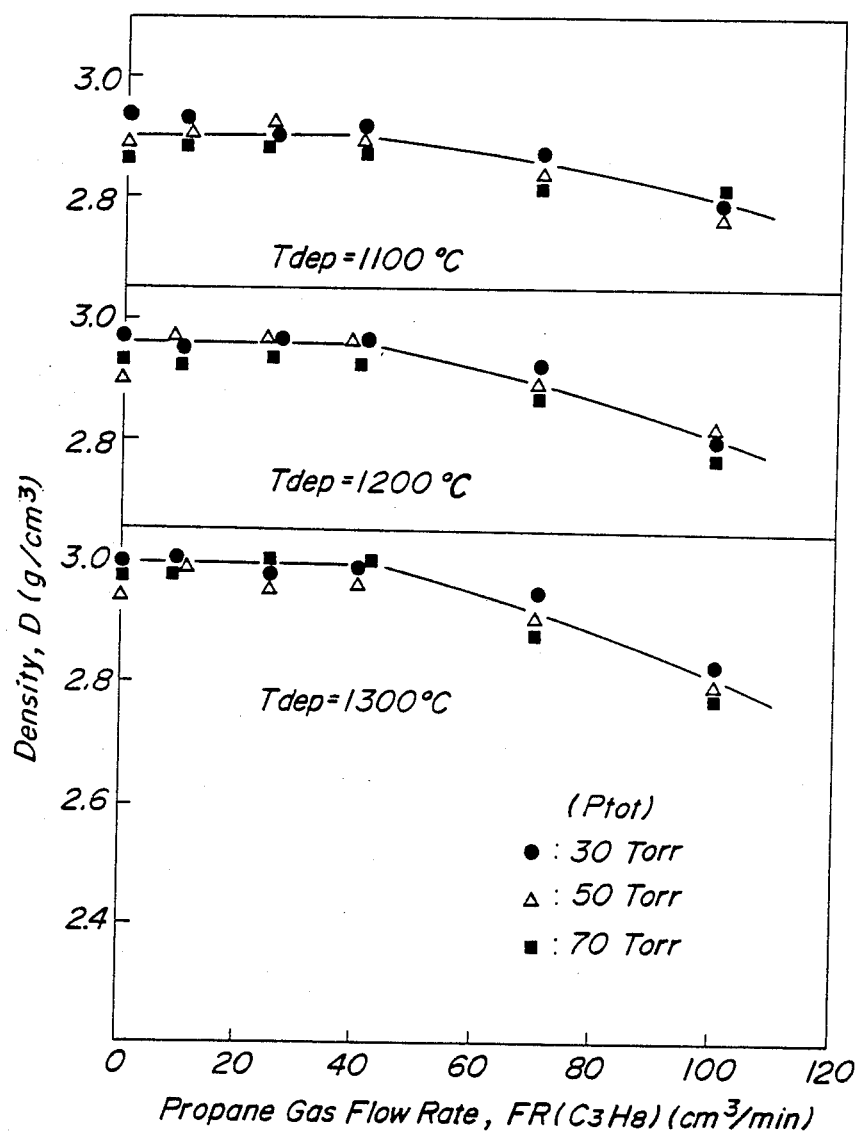
FIG. 15 is a characteristic graph showing relations between propane gas flow rate and density D of the massive and pure $Si_3N_4$—C series amorphous solids prepared at deposition temperatures of 1,100°, 1,200° and 1,300° C. under various total gas pressures in the furnace.
Figure 16:
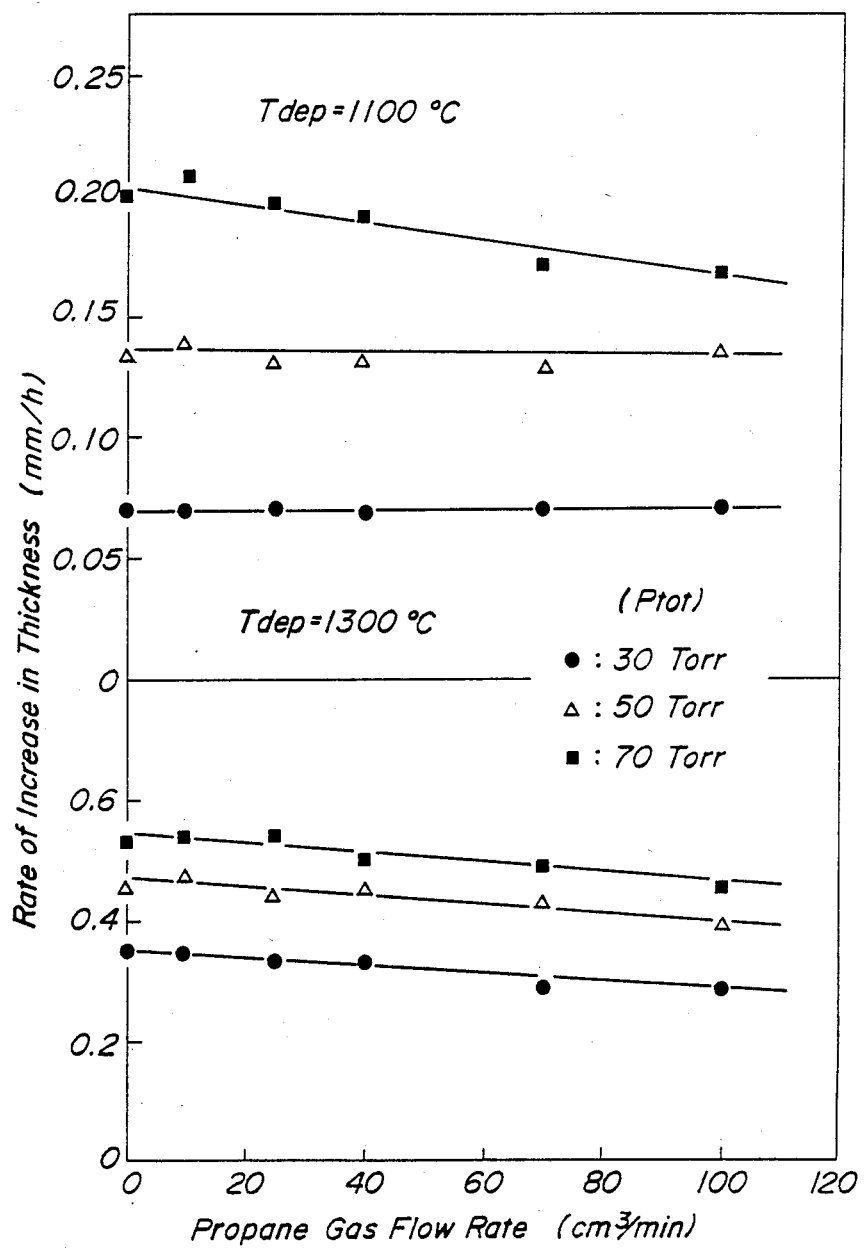
FIG. 16 is a characteristic graph showing relations between propane gas flow rate and rate of increase in thickness of the massive and pure $Si_3N_4$—C series amorphous solids prepared at deposition temperatures of 1,100° and 1,300° C. under various total gas pressures in the furnace.
Figure 17:
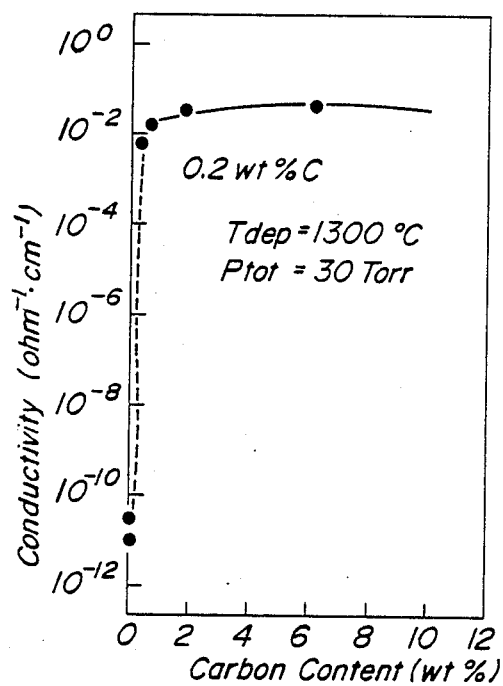
FIG. 17 is a characteristic graph showing a relation between carbon content and electrical conductivity of the massive and pure $Si_3N_4$—C series amorphous solid prepared at $T_{dep}=1,300°$ C. and $P_{tot}=30$ Torr.
Figure 18:
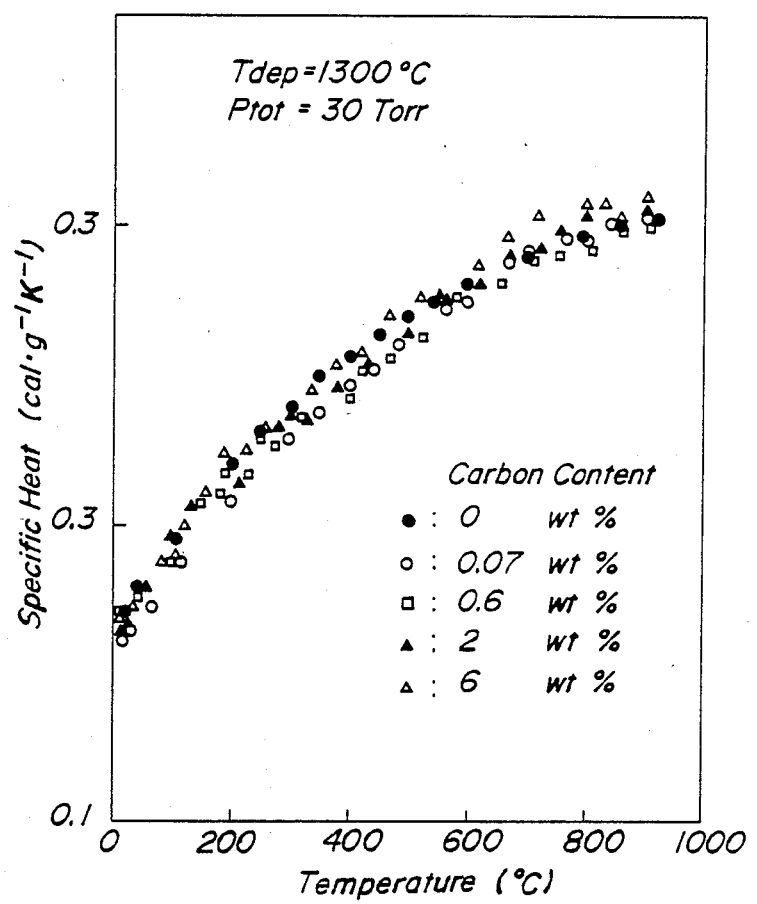
FIG. 18 is a characteristic graph showing relations between temperature and specific heat value of the massive and pure $Si_3N_4$—C series amorphous solids having various carbon contents and prepared at $T_{dep}=1,300°$ C. and $P_{tot}=30$ Torr.

The $Si_3N_4$—C series amorphous solid has a low electric resistance of $10^{-12}$ times as compared with $Si_3N_4$ of the U.S. Pat. No. 4,118,539 at ambient temperature, so that it is exceedingly electrically conductive. An illustrative example is shown in FIG. 1 for the $Si_3N_4$—C series amorphous materials prepared at a deposition temperature of 1,300° C. Additionally, temperature coefficients of electric resistance decrease to considerably small values. Relations between other typical ceramics and their electrical conductivities are shown in FIG. 2 for comparison use. As shown in FIG. 2, electrical conductivities of the $Si_3N_4$—C series amorphous solids of the present invention has intermediate values between those of the insulative ceramics and conductive ceramics.

As the silicon source gas, use is made of at least one of silicon halides, silicon hydrides or silicon hydrogen halides as described in the U.S. Pat. No. 4,118,539 or a mixture thereof. Among them, $SiCl_4$, $SiH_4$ and $SiHCl_3$ are preferable.

As the nitrogen source gas, use is made of at least one of nitrogen hydrides or ammonium halides as described in the U.S. Pat. No. 4,118,539 or a mixture thereof. Among them, $NH_3$ is preferable, because it is relatively cheap and commercially available.

As the carbon source gas, use is made of at least one of carbon chlorides or hydrocarbons or a mixture thereof. Among them, $CH_4$, $C_2H_6$ and $C_3H_8$ are preferable, because they are relatively cheap and commercially avilable.

As at least one of the carbon source gas and the silicon source gas, use is made of at least one of methylchlorosilane compounds.

In a preferred embodiment of the present invention, the hydrogen source gas containing the silicon source gas is introduced into the furnace.

Prior to initiation of deposition, preferably the reaction furnace is degassed by evacuating to a vacuum of about 0.001 mmHg ($10^{-3}$ Torr) and heating the substrate at a temperature of about 700° to 800° C. for a few minutes. Subsequently, the atmosphere of the furnace is changed to hydrogen atmosphere and the substrate is heated to a desired temperature and the deposition source gases are charged in the furnace. Any substrate can be used that can withstand the deposition temperature and resist the deposition gas atmosphere. Generally, graphite, silicon carbide or silicon nitride is used.

A carrier gas such as Ar, $N_2$ or $H_2$ is optionally used for introducing at least one of the source gases.

Deposition speed or rate and deposition amount are determined by selecting pressure, temperature and types of used deposition source gases within the aforementioned ranges. Deposition speed and deposition amount can also be determined by flow rates of the source gases, mixing ratio of the source gases and reaction time.

Carbon content of the $Si_3N_4$—C series amorphous materials is mainly adjusted by regulating a flow rate of the carbon source gas.

The source gases can be introduced into the furnace simultaneously through a one tube nozzle. However, preferably a double tube nozzle is used and the nitrogen source gas is introduced into the furnace through an inner tube of the double tube nozzle and the other source gases are introduced into the furnace through an outer tube of the double tube nozzle.

In an experimental embodiment of the present invention, substantially the same apparatus as that used in the U.S. Pat. No. 4,118,539 was used. By using propane gas as the carbon source gas at a flow rate of not more than 150 cm$^3$/min, carbon content of the amorphous material was controlled to not more than about 10% by weight. It was possible to obtain the amorphous solid containing carbon more than about 10% by weight, but the solid was not preferable because cracks were markedly formed.

In operating the process of the present invention, the manners of operating the apparatus of the U.S. Pat. No. 4,118,539 can arbitrarily be used.

Suitable range and unsuitable ranges of the deposition condition in the present invention are shown in FIGS. 3 to 6.

We have made various researches and experiments leading to the present invention. Illustrative examples thereof are shown in the following Table I as well as in the attached FIGS. 1 to 19.

TABLE I

| Deposition conditions | |
|---|---|
| Deposition Temperature, $T_{dep}$(°C.): | 1100 to 1600 |
| Total Gas Pressure, $P_{tot}$(Torr): | 30 to 100 |
| Gas Flow Rate, FR(cm$^3$/min) | |
| FR(H$_2$): | 700 |
| FR(SiCl$_4$): | 170 |
| FR(NH$_3$): | 60 |
| FR(C$_3$H$_8$): | 0 to 200 |
| Deposition Time, t(h): | 0.5 to 8 |

The massive and pure Si$_3$N$_4$—C series amorphous solid of the present invention can be used in the following fields, utilizing the above excellent electrical characteristics in addition to superior properties of CVD amorphous Si$_3$N$_4$.

(1) As a coating material
  (a) By coating a surface of an electrically insulative material, the material can be imparted with electrical conductivity.
  (b) By coating a surface of an electrically insulative material, static electricity can be removed.
  (c) By coating a surface of an arbitrary material such as crucible, chemical plant, rocket nozzle or the like, a reaction with a high temperature corrosive gas, a chemical substance or a molten metal is prevented.
  (d) By coating a surface of a mechanical part such as bearing, gear and the like which requires abrasive-resistant property, seizure at high temperature and abrasion are prevented.
  (e) By coating a surface of an article, part or element, electronic parts can be obtained.

(2) As a film or massive solid
  (f) A light and highly hard heating element such as recording heat styli, etc.
  (g) A recording electrode of an electrostatic printing device, etc.
  (h) A high temperature-filament.
  (i) A high temperature-heating element such as heating rod, etc.
  (j) Electronic parts for electronic devices such as connector, switching element, resistor, computer and communication system, etc.

DESCRIPTION OF THE PREFERRED EMBODIMENTS

Hereinafter, the present invention will be explained in more detail with reference to preferred embodiments which, however, should not be construed by any means as limitations of the present invention.

EXAMPLE 1

An apparatus having substantially the same structure as that shown in U.S. Pat. No. 4,118,539 is used. A plate-like substrate composed of an artificial graphite is heated to a temperature of 1,300° C. by passing an electric current, and propane gas at a flow rate of 70 cm$^3$/min, ammonia gas at a flow rate of 60 cm$^3$/min and a hydrogen gas at a flow rate of 700 cm$^3$/min saturated by silicon tetrachloride vapor at 20° C. are charged in the reaction furnace through a double tube nozzle, and a total gas pressure of 30 mmHg is maintained in the furnace. Thus, the flow rate of SiCl$_4$ is 170 cm$^3$/min. In case of charging, the ammonia gas is introduced into the furnace through an inner tube of the double tube nozzle and the other gases are introduced through an outer tube of the double tube nozzle. Pressure in the reaction furnace is 30 mmHg. After introducing the gases for 6 hours, electric current is cut off and the furnace is cooled and the substrate in the furnace is taken out. As a result, a black plate-like Si$_3$N$_4$—C series amorphous solid having a thickness of 1.8 mm is obtained on the substrate surface. Deposition speed of the material is 0.3 mm/hr.

Characteristic properties of the Si$_3$N$_4$—C series amorphous solids are determined to obtain the following values. Density 2.95 g/cm$^3$. Si/N ratio 0.67. Carbon content 2% by weight. Micro Vickers hardness 2,700 kg/mm$^2$ (100 g load). Electrical resistivity 32 Ωcm (at 200° C.) and 20 Ωcm (at 900° C.). Thermal conductivity 0.0085 cal/cm·sec·K. Specific heat 1.7 cal/g·K. Thermal diffusivity 0.017 cm$^2$/sec. No SiC is detected by X-ray diffraction.

EXAMPLE 2

The same apparatus as that used in Example 1 is used and the same operations as in Example 1 are carried out to deposit Si$_3$N$_4$—C series amorphous solid. Deposition conditions are a deposition temperature of 1,300° C., an ammonia gas flow rate of 60 cm$^3$/min, a propane gas flow rate of 100 cm$^3$/min, a hydrogen gas flow rate of 700 cm$^3$/min saturated by silicon tetrachloride vapor at 20° C. and a total gas pressure in the furnace of 70 mmHg. Thus, the flow rate of SiCl$_4$ is 170 cm$^3$/min. After 6 hours reaction, a black plate-like Si$_3$N$_4$—C series amorphous solid having a thickness of 3 mm is obtained on the substrate surface. Deposition speed of the solid is 0.5 mm/hr.

Characteristic properties of the Si$_3$N$_4$—C series amorphous solid are determined to obtain the following values. Density 2.8 g/cm$^3$. Si/N ratio 0.67. Carbon content 10% by weight. Micro Vickers hardness 2,600 kg/mm$^2$ (100 g load). Electrical resistivity 20 Ωcm (at 200° C.) and 15 Ωcm (at 900° C.). Thermal conductivity 0.0065 cal/cm·sec·K. Specific heat 1.7 cal/g·K. Thermal diffusivity 0.013 cm$^2$/sec.

EXAMPLE 3

The same apparatus as in Example 1 is used. As a heating element, artificial graphite with a crucible shape is used. Commercial sintered silicon nitride is placed in the crucible. The Si$_3$N$_4$—C series amorphous material is deposited on the commercial silicon nitride in the same manner as in Example 1.

Deposition is performed under the following conditions. Deposition temperature 1,300° C. Ammonia gas flow rate 60 cm$^3$/min. Propane gas flow rate 40 cm$^3$/min. Hydrogen gas flow rate of 700 cm$^3$/min saturated by silicon tetrachloride vapor at 20° C. Thus, the flow rate of SiCl$_4$ is 170 cm$^3$/min. Total gas pressure in the furnace 30 mmHg. Reaction time 10 min. As a result, a black film Si$_3$N$_4$—C series amorphous material having a thickness of 50 μm is obtained on the sintered silicon nitride surface. Thus, deposition speed of the material is 0.3 mm/hr. Carbon content of the produced Si$_3$N$_4$—C series amorphous material is 0.6% by weight. The Si$_3$N$_4$—C series amorphous solid film has a very strong intimate adherence to the commercial sintered silicon nitride and does not peel off even when quenched from 1,300° C. to an ambient temperature.

Although the present invention has been explained in detail with reference to specific values and embodiments, it will of course be apparent to those skilled in the art that many variations and modifications are possible without departing from the broad aspect and scope of the present invention as defined in the appended claims.

What is claimed is:

1. A coated article comprising a substrate having coated thereon a massive and pure $Si_3N_4$—C series amorphous solid material obtained directly by a chemical vapor deposition process using a hydrogen source gas, occuring under a reduced total pressure of about 30–70 mmHg, said material comprises a deposited amorphous $Si_3N_4$ matrix and codeposited carbon uniformly distributed in said matrix, having an electrical conductivity $\sigma$ of a formula $$\sigma = \sigma_0 \exp(-E/2kT)$$

wherein $\sigma_0$ is an electrical conductivity at 0° K., E is a value of 0.02–0.06 eV, k is the Boltzmann constant and T is an absolute temperature, a carbon content of about 0.2–10% by weight, an electrical conductivity $\sigma$ of about $10^{-3}$ to $10^{-1}$ $\Omega^{-1}$ $cm^{-1}$ at a temperature from ambient to about 900° C., a density of about 2.7 to 3.0 $g/cm^3$, a thermal conductivity of about 0.004–0.010 cal/cm sec K at ambient temperature, a specific heat of about 0.16 cal/g K at ambient temperature, a thermal diffusivity of about 0.010–0.022 $cm^2/sec$ at ambient temperature, and a micro Vickers hardness of about 2,500–3,500 $kg/mm^2$ (100 g load) at ambient temperature.

2. A light and highly hard heating element produced from the $Si_3N_4$—C series amorphous solid as defined in claim 1.

3. A recording heat styli having an element as defined in claim 2.

4. A recording electrode of an electrostatic printing device having an element as defined in claim 2.

5. A high temperature filament having an element as defined in claim 2.

6. A high temperature-heating rod having an element as defined in claim 2.

7. An electronic part having an element as defined in claim 2.

8. A coated article comprising a substrate having coated thereon a massive and pure $Si_3N_4$—C series amorphous solid material obtained directly by a chemical vapor deposition process using a hydrogen source gas in addition to a silicon source gas, a nitrogen source gas and a carbon source gas in the reaction furnace, occurring under a reduced total pressure of about 30–70 mmHg, said material comprises a deposited amorphous $Si_3N_4$ matrix and codeposited carbon uniformly distributed in said matrix, having an electrical conductivity $\sigma$ of a formula $$\sigma = \sigma_0 \exp(-E/2kT)$$

wherein $\sigma_0$ is an electrical conductivity at 0° K., E is a value of 0.02–0.06 eV, k is the Boltzmann constant and T is an absolute temperature, a carbon content of about 0.2–10% by weight, an electrical conductivity $\sigma$ of about $10^{-3}$ to $10^{-1}$ $\Omega^{-1}$ $cm^{-1}$ at a temperature from ambient to about 900° C., a density of about 2.7 to 3.0 $g/cm^3$, a thermal conductivity of about 0.004–0.010 cal/cm sec K at ambient temperature, a specific heat of about 0.16 cal/g K at ambient temperature, a thermal diffusivity of about 0.010–0.022 $cm^2/sec$ at ambient temperature, and a micro Vickers hardness of about 2,500–3,500 $kg/mm^2$ (100 g load) at ambient temperature.

9. A coated article comprising a substrate having thereon a massive and pure $Si_3N_4$—C series amorphous solid coating obtained directly on a surface of a heated substrate by a chemical vapor deposition process using a hydrogen source gas, occurring under a reduced total pressure of about 30–70 mmHg, said coating comprises a deposited amorphous $Si_3N_4$ matrix and codeposited carbon uniformly distributed in said matrix, having an electrical conductivity $\sigma$ of a formula $$\sigma = \sigma_0 \exp(-K/2kT)$$

wherein $\sigma_0$ is an electrical conductivity at 0° K., E is a value of 0.02–0.06 eV, k is the Boltsmann constant and T is an absolute temperature, a carbon content of about 0.2–10% by weight, an electrical conductivity $\sigma$ of about $10^{-3}$ to $10^{-1}$ $\Omega^{-1}$ $cm^{-1}$ at a temperature from ambient to about 900° C., a density of about 2.7 to 3.0 $g/cm^3$, a thermal conductivity of about 0.004–0.010 cal/cm sec K at ambient temperature, a specific heat of about 0.16 cal/g K at ambient temperature, a thermal diffusivity of about 0.010–0.022 $cm^2/sec$ at ambient temperature, and a micro Vikers hardness of about 2,500–3,500 $kg/mm^2$ (100 g load) at ambient temperature said substrate being selected from the group consisting of graphite, silicon carbide, and silicon nitride.

10. A coated article comprising a substrate having coated thereon a massive and pure $Si_3N_4$—C series amorphous solid coating obtained directly on a surface of a heated substrate arranged in a reaction furnace, by a chemical vapor deposition process using a hydrogen source gas, in addition to a silicon source gas, a nitrogen source gas, and a carbon source gas in the reaction furnace, occurring under a reduced total pressure of about 30–70 mmHg, said coating comprises a deposited amorphous $Si_3N_4$ matrix and codeposited carbon uniformly distributed in said matrix, having an electrical conductivity $\sigma$ of a formula $$\sigma = \sigma_0 \exp(-K/2kT)$$

wherein $\sigma_0$ is an electrical conductivity at 0° K., E is a value of 0.02–0.06 eV, k is the Boltsmann constant and T is an absolute temperature, a carbon content of about 0.2–10% by weight, an electrical conductivity $\sigma$ of about $10^{-3}$ to $10^{-1}$ $\Omega^{-1}$ $cm^{-1}$ at a temperature from ambient to about 900° C., a density of about 2.7 to 3.0 $g/cm^3$, a thermal conductivity of about 0.004–0.010 cal/cm sec K at ambient temperature, a specific heat of about 0.16 cal/g K at ambient temperature, a thermal diffusivity of about 0.010–0.022 $cm^2/sec$ at ambient temperature, and a micro Vikers hardness of about 2,500–3,500 $kg/mm^2$ (100 g load) at ambient temperature said substrate being selected from the group consisting of graphite, silicon carbide, and silicon nitride.

* * * * *